(12) United States Patent
Canepa

(10) Patent No.: US 10,909,051 B2
(45) Date of Patent: Feb. 2, 2021

(54) NAND FLASH RESET CONTROL

(71) Applicant: Seagate Technology LLC, Cupertino, CA (US)

(72) Inventor: Timothy Canepa, Los Gatos, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 15/610,815

(22) Filed: Jun. 1, 2017

(65) Prior Publication Data
US 2018/0349301 A1 Dec. 6, 2018

(51) Int. Cl.
G06F 13/16 (2006.01)
G06F 13/40 (2006.01)
G11C 16/10 (2006.01)
G11C 16/26 (2006.01)

(52) U.S. Cl.
CPC ...... *G06F 13/1668* (2013.01); *G06F 13/4004* (2013.01); *G06F 13/4068* (2013.01); *G11C 16/10* (2013.01); *G11C 16/26* (2013.01)

(58) Field of Classification Search
CPC ...................................................... G06F 1/206
See application file for complete search history.

(56) References Cited

U.S. PATENT DOCUMENTS

| | | | |
|---|---|---|---|
| 5,546,268 A * | 8/1996 | Hurley | H01H 47/325 361/154 |
| 5,825,691 A * | 10/1998 | McClure | G11C 7/14 365/189.16 |
| 6,650,155 B1 | 11/2003 | Nguyen et al. | |
| 6,998,884 B2 | 2/2006 | Ng et al. | |
| 8,300,495 B2 | 10/2012 | Tak et al. | |
| 9,053,015 B2 * | 6/2015 | Vasilyuk | G06F 12/0246 |
| 9,507,710 B2 | 11/2016 | Conklin et al. | |
| 2011/0235404 A1 * | 9/2011 | Scheuerlein | G11C 7/12 365/148 |

OTHER PUBLICATIONS electronics-tutorials.ws/logic/pull-up-resistor.html, Pull-Up resistor, Aug. 3, 2016 (Year: 2016).*

* cited by examiner

*Primary Examiner* — Henry Tsai
*Assistant Examiner* — Juanito Borromeo
(74) *Attorney, Agent, or Firm* — Hall Estill Attorneys at Law; Mitchell McCarthy

(57) ABSTRACT

Method and apparatus for managing a non-volatile memory (NVM). In some embodiments, a memory module has a memory module electronics (MME) circuit configured to program data to and read data from solid-state non-volatile memory cells of the NVM. A controller is adapted to communicate commands and data to the MME circuit via an intervening data bus. The controller operates to reset the MME circuit by issuing a reset command to the MME circuit over the data bus, activating a decoupling circuit coupled between the data bus and a reference line at a reference voltage level to remove capacitance from the data bus resulting from the reset command, and subsequently sensing a voltage on the data bus. In some cases, multiple MME circuits and NVMs may be arranged on a plurality of flash dies which are concurrently reset by the controller.

19 Claims, 3 Drawing Sheets

NAND FLASH RESET CONTROL

SUMMARY

Various embodiments of the present disclosure are generally directed to the management of data in a memory, such as but not limited to a flash memory.

In accordance with some embodiments, a memory module has a memory module electronics (MME) circuit configured to program data to and read data from solid-state non-volatile memory cells of a non-volatile memory (NVM). A controller circuit is adapted to communicate commands and data to the MME circuit via an intervening data bus. The controller circuit operates to reset the MME circuit by issuing a reset command to the MME circuit over the data bus, activating a decoupling circuit coupled between the data bus and a reference line at a reference voltage level to remove capacitance from the data bus resulting from the reset command, and subsequently sensing a voltage on the data bus.

These and other features which may characterize various embodiments can be understood in view of the following detailed discussion and the accompanying drawings.

DETAILED DESCRIPTION

Figure 1:
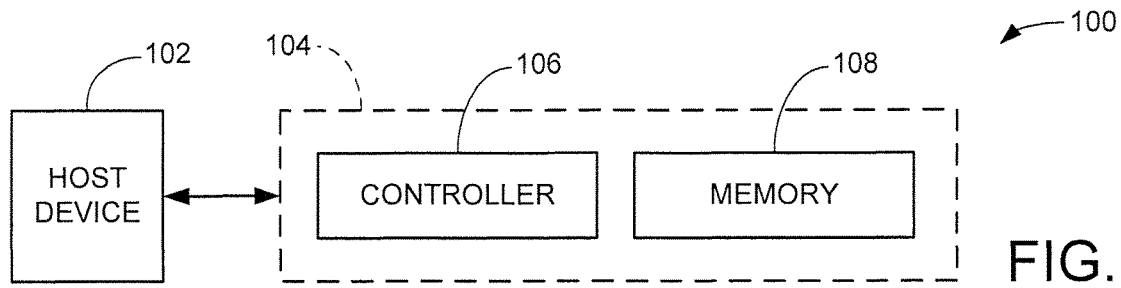
FIG. 1 provides a functional block representation of a data storage device in accordance with various embodiments.

The present disclosure generally relates to managing data stored in a memory, such as but not limited to a flash memory of a solid state drive (SSD).

A wide variety of data storage memories are known in the art. Some memories are formed from solid-state memory cells which store data in relation to an amount of accumulated charge on a floating gate structure, such as with flash memory. An erasure operation is generally required before new data can be written to a given flash memory location.

Some flash memory devices such as solid state drives (SSDs) include a flash memory module (device) and a controller. A pull system is used whereby the controller issues commands to the memory module and subsequently checks to determine if the requested command has been completed. In this way, the memory module is essentially a slave device with limited interface capabilities.

A typical NAND flash module interface includes a number of control signals that are driven by the controller, and a bi-directional data bus. In some cases, a single open drain ready/busy # (R/B #) signal path may be shared by multiple NAND flash devices (e.g., flash dies with one or more flash memory arrays and a memory module electronics, or MME circuit). Controllers in current generation SSDs seldom utilize the R/B # line; because it is shared by multiple devices, a "ready" or "busy" signal on the line cannot be used to reliably determine the operational state of a given device.

In the absence of the R/B # signal, there is essentially no feedback from the slave NAND device to indicate the status of the memory. Controllers are usually configured to follow the designated protocol in issuing commands, followed by waiting for the NAND device to respond. Some amount of tuning may be required in order to establish the appropriate timing for each type of command (e.g., read, write, status, etc.).

While this type of operation is acceptable once the NAND flash device is up and running, it presents a particular challenge in the context off reset operation. During a NAND reset, the rudimentary electronics of the NAND flash device (e.g., the MME) undergo an initialization operation to place the MME in an operationally ready state. The NAND reset may involve various initialization and self-test steps that are required before the memory device is able to receive, interpret and drive responses across the bus.

A status command can be issued by the controller during the NAND reset interval, but until the bus drivers of the NAND flash device are up and running, the controller cannot reliably determine that the memory device has received and responded to the status command. In many cases. SSD initialization routines simply rely upon the specified worse-case NAND reset ready time, which may be several milliseconds or more, before polling the memory module to determine whether it has completed its reset operation and is ready to respond to commands. This can add significant delay to the SSD initialization process.

A typical NAND reset operation may involve the following steps. First, the controller power cycles the NAND memory module by dropping the input supply voltage below a given voltage threshold, followed by raising the supply voltage back to a normal operational level. Second, after a specified amount of time the controller forwards a reset FFh) command to the memory device. Third, after an additional required amount of time, the controller issues a read status (e.g., 70*h*) command to the device to determine if the device has completed the reset sequence. If a ready response is not received, the foregoing process is repeated. It can take a significant amount of time to perform each pass through this sequence.

Another limitation with this approach is that these various steps are not always reliable. If the system design/board is adequate, the first and second steps will usually be received by the memory device (hard voltage reset followed by soft reset command). The third step, however, is often subject to significant variability; the minimum time to complete the reset is not usually very consistent, and if the flash device did not reset properly, the device may not respond at all. This raises the possibility that the read status command or even the reset command may not have been accepted, or even recognized, by the memory device.

If a memory device does not reset properly and is not in a position to affirmatively drive a status response, the controller essentially reads back whatever capacitance is left on the data bus as a result of the status command. This can either be interpreted as garbage or, in the worst case scenario, interpreted as a successful reset by the device. This may lead to the controller issuing further commands or taking other actions while the memory module is not properly reset.

Accordingly, various embodiments of the present disclosure are generally directed to an apparatus and method for managing a memory in a data storage device, such as an SSD. As explained below, some embodiments include a controller circuit coupled to a memory module. The controller circuit may be a hardware based and/or programmable processor circuit that provides top level control for the storage device. The memory module may be arranged as one or more dies each having a memory module electronics (MME) circuit and a non-volatile memory (NVM). In some cases, the dies are flash dies and the NVM constitutes flash memory, although such are not necessarily required.

During a reset sequence to transition the memory module to an operationally ready condition, the controller circuit issues a reset input to the memory module. In response, the MME circuit initiates a reset operation. The controller circuit waits a selected amount of time, and issues a read status request to the MME circuit across a data path (e.g., bi-directional data bus) to determine whether the MME circuit has completed the reset operation. The controller circuit activates a decoupling circuit to remove any residual capacitance from the data path, followed by a read enable command. The read status and read enable commands may be issued on a per die basis.

In this way, after the read status request is sent, but before the read enable is strobed low to read the status from the module, a weak pull down resistor is enacted to drain the capacitance from the bus. The time required to remove the capacitance will be based on the system design. This essentially guarantees that when the read enable is strobed, the controller will in fact be reading whatever data the NAND device is outputting on the bus (assuming the NAND device has completed the reset), or will read all zeros if the NAND device is not yet ready to respond.

These and other features and advantages of various embodiments can be understood beginning with a review of FIG. 1 which provides data handling system 100. The system 100 includes a host device 102 and a data storage device 104. The data storage device 104 includes a controller 106 and a memory module 108. The controller is a programmable processor and/or hardware based circuit that provides top level communication and control functions for data transfers to and from non-volatile memory (NVM) storage in the memory module 108. The data transfers between the host device and the data storage device may be provided via a selected protocol.

Figure 2:
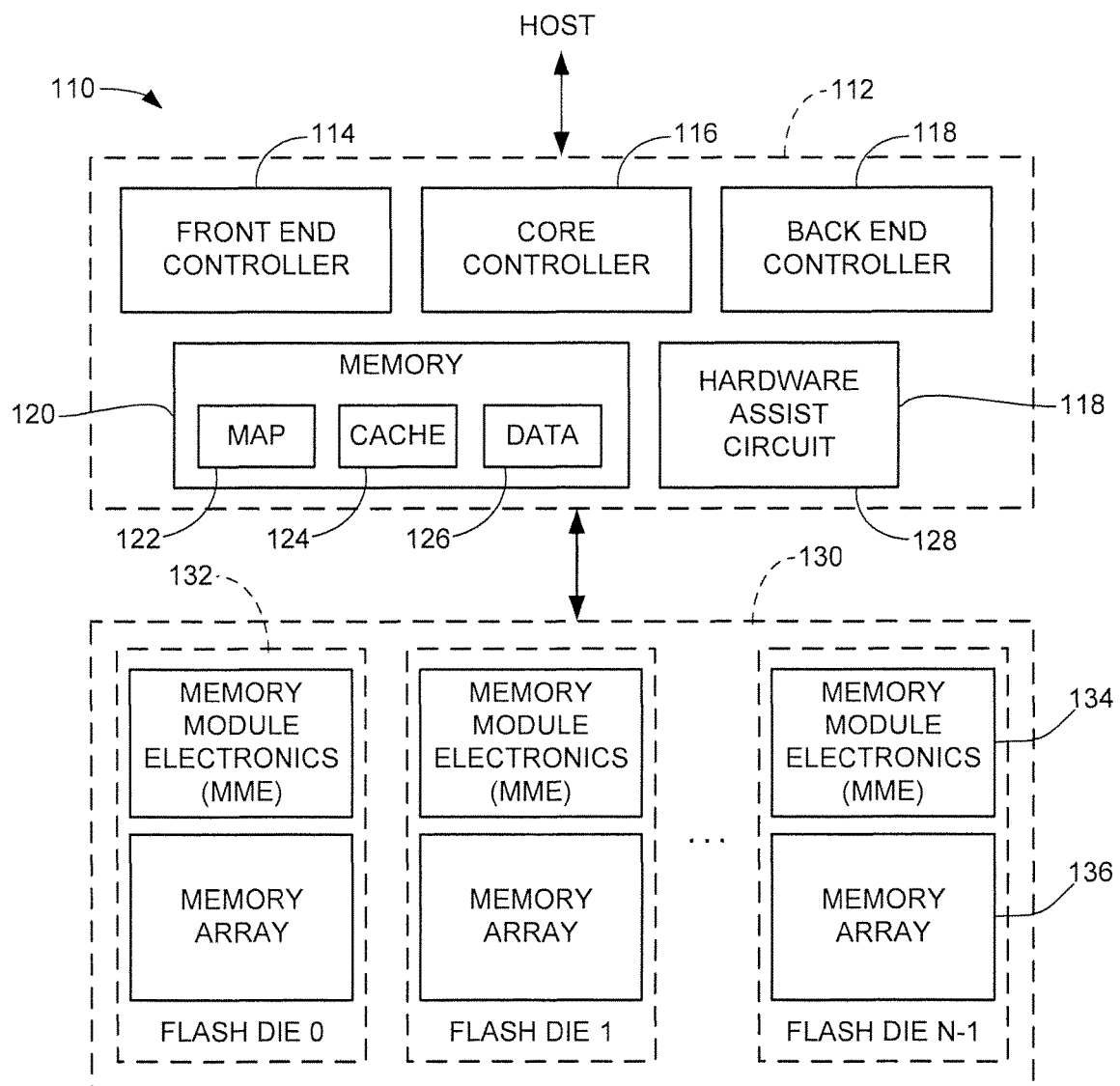
FIG. 2 shows aspects of the device of FIG. 1 characterized as a solid state drive (SSD) in accordance with some embodiments.

FIG. 2 shows a data storage device 110 generally corresponding to the device 104 in FIG. 1. The device 110 is configured as a solid state drive (SSD) that communicates with a host device such as 102 in FIG. 1 via one or more Peripheral Component Interface Express (PCIe) ports, although other configurations can be used.

The SSD 110 includes a controller circuit 112 (hereinafter "controller") having a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 120 represents various forms of volatile and non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers. A non-processor based hardware assist circuit 128 may enable the offloading of certain memory management tasks by one or more of the controllers as required.

A memory module 130 is provided with communication and control electronics and non-volatile memory (NVM). In the present example, the memory module 130 is arranged as a plural number N flash dies 132. Each flash die 132 has a memory module electronics (MME) circuit 134 and a flash memory array 136. The controller 112 communicates with the MME circuits 134 via one or more shared busses to transfer data to the arrays 136, as explained below.

Each MME 132 includes read/write/erase (R/W/E) circuitry and other control circuitry incorporated into the memory module 130 to write data to the flash memory 132. The MME may be formed of one or more programmable processor circuits with associated programming in memory, and/or hardware circuits adapted to carry out various commands and data transfers with the controller 112.

While not limiting, it will be recognized by those skilled in the art that current generation SSDs and other data storage device systems can be formed from integrated memory modules such as 130 that are commercially available from a source of such devices. The memory modules may be integrated into an SSD by a device manufacturer which supplies the controller functions and tailors the controller to operate with the memory module. The controller and memory module are thus separate operational entities which communicate across one or more defined data and command interfaces. A "pull" system is commonly used in which the controller 112 issues commands and then repetitively checks (polls) the status of those commands by the memory module 130 to determine whether the commands have been completed.

Figure 3:
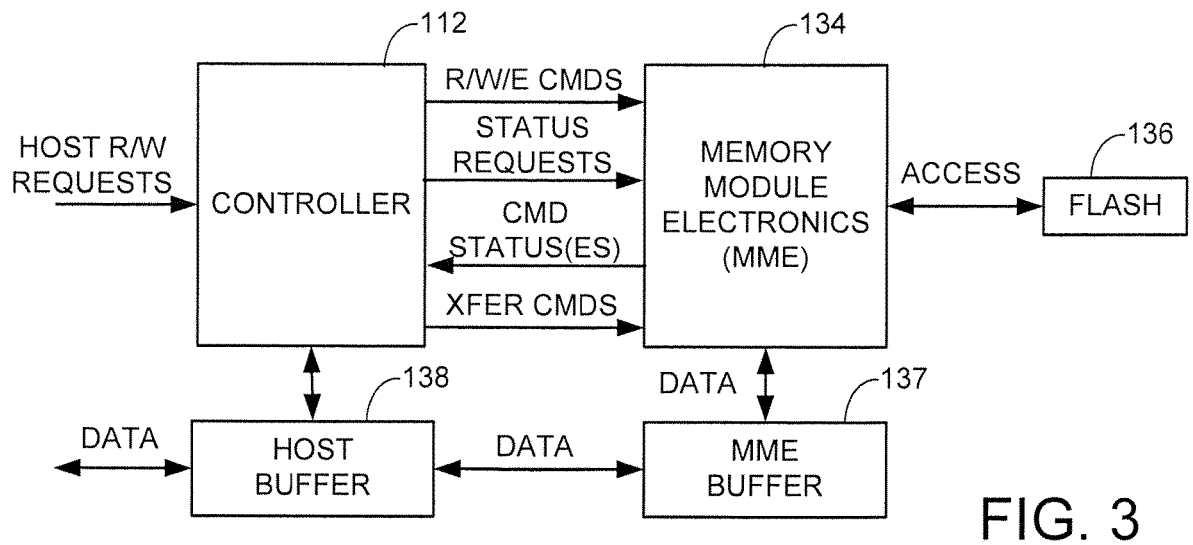
FIG. 3 illustrates data and command flows between the controller and memory module electronics (MME) of FIG. 2 in some embodiments.

FIG. 3 shows aspects of the controller 112 and a selected MME 136 in greater detail. An MME buffer memory 137 is incorporated into or otherwise utilized by the MME 136 to temporarily store data being transferred between the flash memory 136 and a host data buffer 138 of the controller 112. To effect such data transfers, the controller 112 issues various commands to the MME 132 such as read commands, write commands, erase commands, data transfer commands and status commands (also referred to as status requests). The MME 134 provides various command status responses to provide an indication of the status of the controller commands.

When reading data from the flash memory 136, the controller 112 issues a read command with a format that identifies the requested data to be returned from the memory to the controller for subsequent transfer to an external host device coupled to the SSD 110 (e.g., host 102 in FIG. 1). The MME 134 schedules and executes the read command and places the retrieved data into the local MME buffer 137. The controller 112 subsequently issues one or more status requests, such as read status enhanced (RSE) commands, which request a status associated with the retrieved data. The MME 134 supplies a read status in response to each status request.

If the MME 134 has not yet completed the data read operation, the MME may signal a "command still pending" type read status (also referred to as a "not ready" response). Once the data read operation is completed, the MME signals a "ready to transfer" read status (also referred to as a "ready" response), which indicates the retrieved data are pending in the MME buffer 137 and ready for transfer to the host buffer 138. The controller 112 subsequently issues a transfer (XFER) command to transfer the data from the MME buffer 137 to the host buffer 138, after which the data are transferred to the requesting host device.

Write (program) operations may be carried out in a similar fashion. The controller 112 issues a write command to the MME 134, and transfers the write data to the host buffer 138 pending transfer to the MME buffer 137 for subsequent processing and writing to the flash memory 136. The MME 134 will signal a command complete type response to the controller 112 to indicate the data have been successfully written to the flash memory.

Erase commands are issued by the controller 112 to erase selected units of memory within the flash memory 136, such as certain erasure blocks which constitute the smallest unit of memory that can be erased at a time. The erasure blocks may be grouped into larger multi-block sets referred to as garbage collection units (GCUs). Responsive to an erase command, the MME 134 will schedule a garbage collection operation in which current (valid) data within the affected blocks are copied to a new location, the blocks are erased and then placed into an allocation pool pending subsequent allocation for the storage of new data. As will be appreciated, erasable memories such as NAND flash typically require an erasure operation before a given location can be overwritten with new data.

Figure 4:
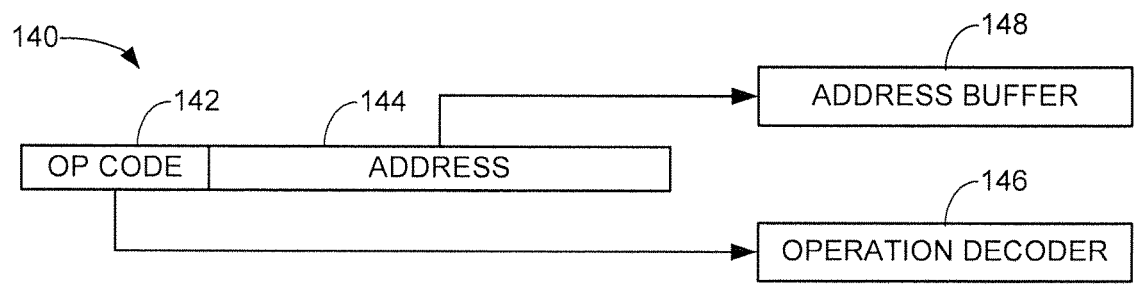
FIG. 4 is an illustrative format for commands issued by the controller to the MME.

These and other various commands issued by the controller 112 to the MME 134 can take a general form as set forth by FIG. 4. An exemplary command 140 includes an op code 142 and an address 144. The op code 142 is a multi-bit sequence that is decoded by an operation decoder 146 of the MME 134 to signify the desired operation, or action, to be taken by the MME. A first multi-bit sequence may signify a read command, a second multi-bit sequence may signify a program command, and so on.

The address 144 represents a corresponding memory location upon which the command is to be executed. The address 144 is loaded to an address buffer 148 of the MME 134. The address can take a variety of forms and may include values identifying a particular die, plane, garbage collection unit (GCU), erasure block, page, row, column offset, etc. Both row and/or column addressing can be used. Other elements may be incorporated into the command format as desired, such as headers, parity bits, etc. but such are omitted for simplicity of illustration.

At this point it will be noted that the particular format of a given command will depend on the communication protocols established to govern I/O communications between the controller and the MME. Commands such as status requests may include an op code portion but not a corresponding address portion, etc.

Figure 5:
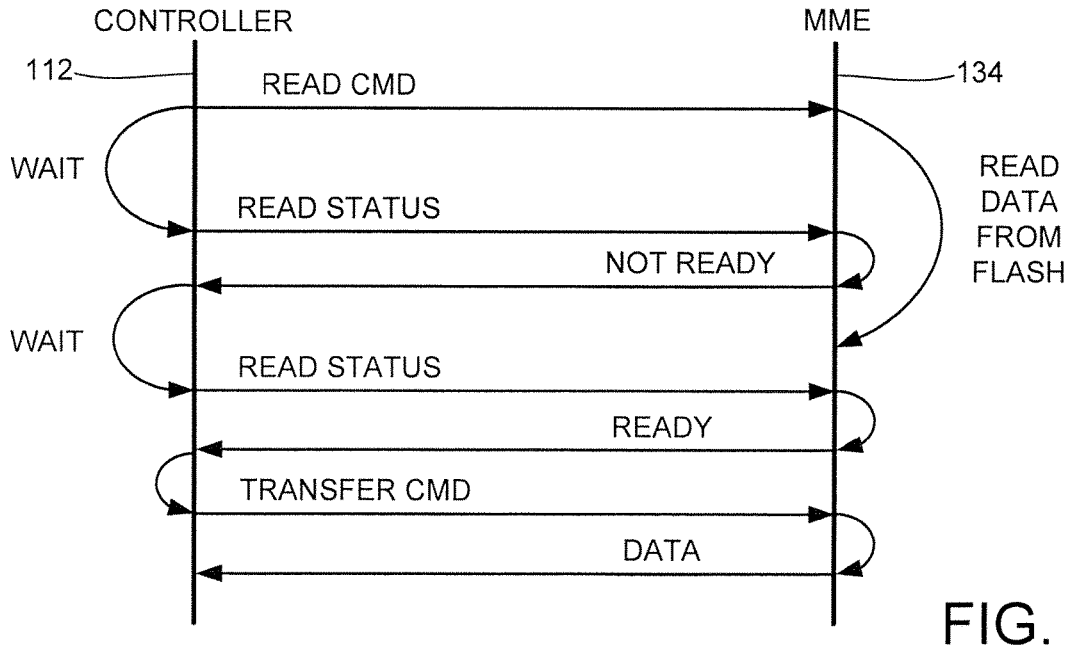
FIG. 5 is a timing diagram showing a pull system used by the controller and MME to transfer commands, status requests and data.

FIG. 5 provides a timing diagram 150 to illustrate a general sequence of operations that are carried out during the processing of a selected command between the controller 112 and the MME 134. In FIG. 5, it is contemplated that the command is a read command to read a selected amount of data from a selected location within the MME. A read command with the format shown in FIG. 4 is issued by the controller 112 to the MME 134. Once received, the MME proceeds to schedule and execute the reading of the requested data from the flash memory 136.

After a given wait period (delay time), the controller issues a first read status request. The MME decodes the command (read status request), determines the state of the system (execution of the command is still in progress), and issues a response (not ready). A subsequent wait time is experienced by the controller, followed by the issuance of a second read status request to the MME. The second wait time may be the same duration as the first wait time, or a shorter wait time may be used for the second interval. In the intervening time between the first and second status requests, the read command is completed and the data are moved to the MME buffer 137 (FIG. 3).

The MME processes the second read status, this time indicating that the data are ready. This is followed by a transfer command from the controller, and the data are transferred from the MME buffer 137 to the host buffer 138 (FIG. 3) pending transfer to the requesting host. It will be appreciated that other commands, such as write commands and erase commands, will follow a similar sequence: a top level command is issued, followed by one or more status requests to track the progress of the command, followed by subsequent processing once the command is indicated as having been completed.

While the foregoing data transfer sequences can be reliably carried out once the MME circuit 134 is in an operationally ready state, initially placing the MME circuit into the operationally ready state is more problematic. As discussed above, existing systems do not generally provide a reliable mechanism for the individual MME circuits 134 among the various flash dies 132 to communicate an operationally ready status after a reset operation.

Figure 6:
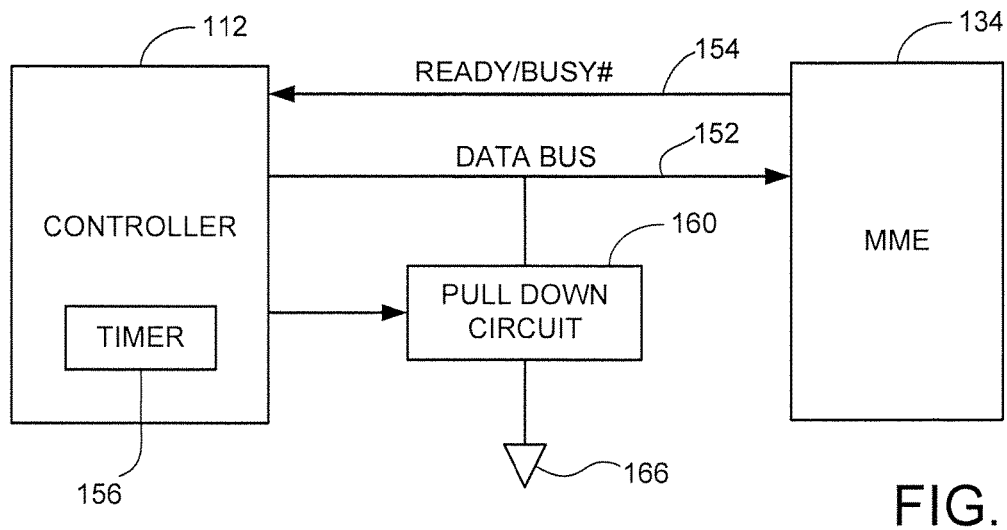
FIG. 6 shows the use of a pull down circuit to poll the status of the MME during a reset operation in some embodiments.

Accordingly, FIG. 6 is another functional block diagram illustrating the controller 112 and the selected MME 134 in further embodiments. The interface pathways between the controller 112 and the MME 134 include a multi-bit bi-directional data bus 152 and an optional ready/busy # (R/#B) line 154.

The bus represents the main data lines over which the respective commands and data transfers of FIGS. 3-5 are communicated between the respective circuits. It will be noted that the data bus may be shared between some or all of the MME circuit 134 in the system, with addressing used to select the individual MME circuits. The ready/busy # line may also be used as desired, but may not be useful in cases such as FIG. 2 where multiple MME circuits 134 are all tied to the same signal line. A timer circuit 156 may be used by the controller circuit 112 to establish predetermined time intervals at which various steps may be taken during the reset process.

Figure 7:
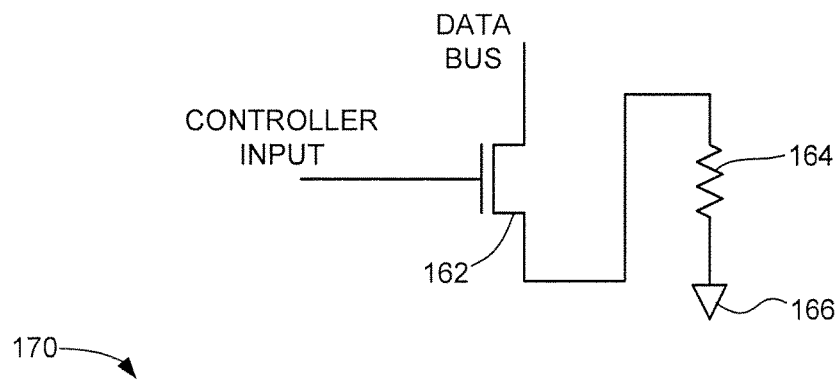
FIG. 7 shows aspects of the pull down circuit of FIG. 6.

A pull down circuit 160 is shown operationally coupled to the data bus 152. As shown in FIG. 7, the pull down circuit 160 can include a simple switching device 162 such as an nMOSFET transistor in series with a low level resistor 164. The respective switching device and resistor are connected in series between the data bus 152 and a reference level (e.g., electrical ground) 166. Other configurations can be used, so that, for example, a series of pull up resistors can be used to couple the data bus to a different positive voltage level (e.g., a Vdd rail voltage, etc.).

The pull down circuit 160 is more generally referred to as a decoupling circuit to drain undesired capacitance from the data bus during a reset sequence of the MME 132. It is contemplated that if the data bus has N distinct conductive paths (e.g., lines 0 to N−1), the circuit 160 will have a corresponding number of switching devices and resistors, one for each of the N paths.

Figure 8:
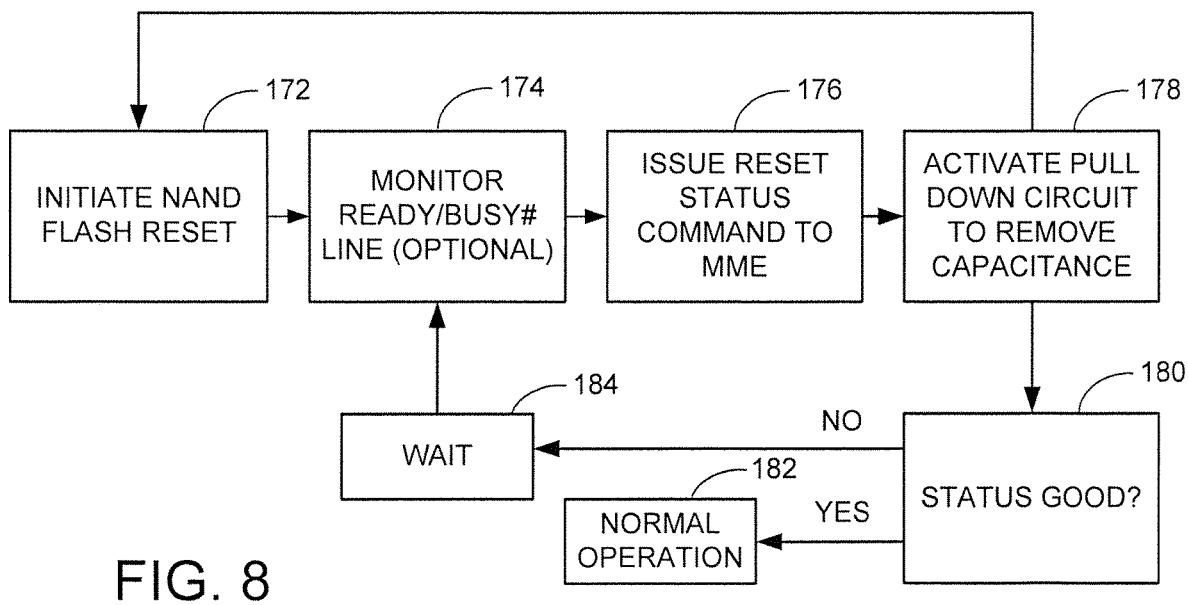
FIG. 8 shows an operational sequence during a NAND flash reset operation in some embodiments.

FIG. 8 represents a reset sequence 170 carried out by the circuitry of FIG. 6 to reset the memory module 130. The sequence may be carried out at any suitable time, such as during an initial SSD initialization process, or at some other time when it is desirable to reset the NAND device 130.

As shown at block 172, the controller 112 initiates the NAND flash reset sequence. This may include a hard power transition to bring an input power terminal to a low value (e.g., zero volts, etc.), followed by a restoration of the supply power to the NAND device. A soft reset command may additionally or alternatively be issued by the controller 112 during this step. It will be appreciated that this sequence (ideally) initiates a self-reset operation by each of the MME circuits 134 in the memory module 130. The time to complete the various resets may vary significantly from one circuit to the next. Some amount of boot code sequence, loading operations, self-tests, etc. will be carried out by each MME circuit during this interval.

While not necessary, in some embodiments the controller may monitor the ready/busy # line 154 to determine whether activity is detected on this line, as shown at block 174. As noted above, since multiple channels are typically coupled to this line, the line itself may not be a reliable indicator of the status of the various MMEs in the course of the reset sequence.

Block 176 shows the issuance of a reset status command to the MME circuit 132 by the controller 112. As discussed above, a single reset value may be broadcast to all MMEs or these may be individually addressed to each MME circuit in turn. This provides an input to the associated MME that, if the MME is in an operationally ready state, the MME will respond with an operationally ready status. If not, it is contemplated that the command will be ignored and no response will be prepared. In some cases, the timer circuit 156 may initiate an elapsed time interval responsive to the issuance of the reset command.

Block 178 shows the activation of the pull down circuit 160 to remove any stray capacitance from the data bus as a result of the command from block 176. This application may be transitory in nature; the controller may issue the command, activate the pull down circuit for sufficient time to effectively remove sufficient levels of capacitance, and then deactivate the circuit. The timer circuit may also provide a suitable time interval for the assertion of the pull down circuit, as desired.

Block 180 next determines whether a status good result is obtained. This can be carried out in a number of ways. As discussed above, a read enable strobe can be applied to read data supplied by the MME. This may be performed at the conclusion of a time interval established by the timer, or based on some other input. If valid data are received, as indicated by block 182, the controller 112 can conclude the MME is in an operationally ready condition and proceed with normal operation to transfer commands and data as discussed above. If not, an additional waiting period is enacted, block 184, and the preceding steps are repeated.

While various embodiments have been described in the environment of a flash memory, such is merely illustrative. The various embodiments can be readily implemented into other forms of solid-state memory including but not limited to spin-torque transfer random access memory (STRAM), resistive random access memory (RRAM), phase change random access memory (PCRAM), magnetic random access memory (MRAM), etc.

Moreover, while the various embodiments described herein have contemplated multiple MME circuits, the foregoing discussion can readily be implemented in a storage module that has a single MME circuit.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
a memory module comprising a non-volatile memory (NVM) and a memory module electronics (MME) circuit configured to program data to and read data from solid-state non-volatile memory cells of the NVM; and
a controller circuit configured to communicate commands and data to the MME circuit via an intervening data bus, the controller circuit further configured to:
deactivate, if activated, a drain circuit to decouple the data bus from a reference line at a reference voltage;
while the drain circuit is deactivated, reset the MME circuit by issuing a reset command to the MME circuit over the data bus;
after the issuing a reset command step, then activating the drain circuit to couple the data bus to the reference line to remove any existing residual capacitance from the data bus resulting from the reset command to ensure a response or lack of response the controller circuit receives from sending a subsequent read enable command to the MME circuit is not affected by the residual capacitance;
after the activating the drain circuit step, then deactivating the drain circuit to decouple the data bus from reference line; and
after the deactivating step, then sending the read enable command to the MME circuit via the data bus.

2. The apparatus of claim 1, wherein the data bus comprises a plural number N parallel data lines, and the drain circuit comprises a corresponding plural number N resistors that are selectively connected in series between the respective plural number N parallel data lines and the reference line.

3. The apparatus of claim 1, wherein the NVM is a first NVM and the MME circuit is a first MME circuit, wherein the memory module further comprises a second NVM and a second MME circuit which operate in parallel with the first NVM and the first NVM circuit, and wherein the controller circuit further operates to concurrently reset the second MME circuit by issuing a second reset command to the second MME circuit over the data bus, activating the drain circuit to remove capacitance from the data bus resulting from the second reset command, after the activating the drain circuit step then deactivating the drain circuit to decouple the data bus from the reference line, and then after the deactivating step then sensing a voltage on the data bus.

4. The apparatus of claim 1, wherein the drain circuit comprises a transistor in series with a pull down resistor, and wherein the controller circuit selectively activates a gate of the transistor to establish a conductive drain path from the data bus, through the transistor and the resistor to the reference line.

5. The apparatus of claim 1, further comprising a timer circuit which initiates a predetermined time interval responsive to the issuing of the reset command.

6. The apparatus of claim 5, wherein the controller circuit senses the voltage on the data bus at a conclusion of the predetermined time interval.

7. The apparatus of claim 5, wherein the controller circuit deactivates the drain circuit at a conclusion of the predetermined time interval.

8. The apparatus of claim 1, wherein the sensing of the voltage on the data bus comprises a read strobe operation, wherein recovery of a positive voltage indicates the MME is in an operationally ready state, and wherein recovery of zero voltage indicates the MME is not in an operationally ready state.

9. The apparatus of claim 1, wherein the controller circuit is further configured to transfer commands and data to the MME responsive to the sensing of a positive voltage on the data bus.

10. The apparatus of claim 1, wherein the NVM is a NAND flash memory.

11. A solid state drive (SSD), comprising:
a memory module comprising a NAND flash memory and a memory module electronics (MME) circuit configured to program data to and read data from the NAND flash memory;
a data bus having opposing first and second ends, the second end connected to the MME circuit;
a drain circuit connected between a medial portion of the data bus and a reference line; and
a controller circuit connected to the first end of the data bus and configured to:
deactivate, if activated, the drain circuit to decouple the data bus from the reference line;
while the drain circuit is deactivated, reset the MME circuit by issuing a reset command to the MME circuit over the data bus;
after the issuing a reset command step, then activating the drain circuit to couple the data bus to the reference line to remove any existing residual capacitance from the data bus resulting from the reset command, to ensure a response or lack of response the controller circuit receives from sending a subsequent read enable command to the MME circuit is not affected by the residual capacitance;
after the activating the drain circuit step, then deactivating the drain circuit; and
after the deactivating step, then sending the read enable command to the MME circuit via the data bus.

12. The SSD of claim 11, wherein the data bus comprises a plural number N parallel data lines, and the drain circuit comprises a corresponding plural number N resistors that are selectively connected in series between the respective plural number N parallel data lines and the reference line.

13. The SSD of claim 11, wherein the drain circuit comprises a transistor in series with a pull down resistor, and wherein the controller circuit selectively activates a gate of the transistor to establish a conductive drain path from the data bus, through the transistor and the resistor to the reference line.

14. A method comprising:
deactivating, if activated, a drain circuit between a data bus and a reference line to decouple the data bus from the reference line;
while the drain circuit is deactivated, communicating, over the data bus from a controller circuit to a memory module electronics (MME) circuit of a memory module, a reset command to reset the MME circuit;
after the issuing a reset command step, then activating the drain circuit to couple the data bus to the reference line and thereby remove any existing residual capacitance from the data bus resulting from the reset command, to ensure a response or lack of response the controller circuit receives from sending a subsequent read enable command to the MME circuit is not affected by the residual capacitance;
after the activating the drain circuit step, then deactivating the drain circuit to decouple the data bus from the reference line;
after the deactivating the drain circuit step, then; and
after the sensing step, then sending the read enable command to the MME circuit via the data bus.

15. The method of claim 14, wherein the data bus comprises a plural number N parallel data lines, and the drain circuit comprises a corresponding plural number N resistors that are selectively connected in series between the respective plural number N parallel data lines and the reference line.

16. The method of claim 14, further comprising initiating a timer circuit responsive to the communicating of the reset command to denote an elapsed time interval, and deactivating the drain circuit at a conclusion of the elapsed time interval.

17. The method of claim 14, further comprising initiating a timer circuit responsive to the communicating of the reset command to denote an elapsed time interval, and sensing the voltage on the data bus at a conclusion of the elapsed time interval.

18. The method of claim 14, wherein a sensing of the voltage on the data bus comprises a read strobe operation, wherein recovery of a positive voltage indicates the MME is in an operationally ready state, and wherein recovery of zero voltage indicates the MME is not in an operationally ready state.

19. The method of claim 14, wherein the NVM is a NAND flash memory.

* * * * *